(12) United States Patent
Joshi (10) Patent No.: US 8,685,829 B1
(45) Date of Patent: Apr. 1, 2014

(54) METHOD FOR FORMING MOS CAPACITOR

(71) Applicant: Intermolecular Inc., San Jose, CA (US)

(72) Inventor: Amol Joshi, Sunnyvale, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/706,680

(22) Filed: Dec. 6, 2012

(51) Int. Cl.
*H01L 21/20* (2006.01)

(52) U.S. Cl.
USPC ..... 438/396; 438/381; 257/532; 257/E21.008

(58) Field of Classification Search
USPC ................ 438/396, 381; 257/532, E21.008
See application file for complete search history.

(56) References Cited

U.S. PATENT DOCUMENTS

2008/0014697 A1\* 1/2008 Furuhata et al. ............. 438/253

OTHER PUBLICATIONS

Wen, H., et al.; Comparison of Effective Work Function Extraction Methods Using Capacitance and Current Measurement Techniques; Jul. 1, 2006; SEMATECH; IEEE Electron Device Letters vol. 27 No. 7 pp. 298601.

Yen, F., et al.; Effective Work Function Engineering of TaxCy Metal Gate on Hfbased Dielectrics; Mar. 1, 2007; TSMC; IEEE Electron Device Letters vol. 28 No. 3 pp. 201203.

Kaushik, V., et al.; Estimation of Fixed Charge Densities in HafniumSilicate Gate Dielectrics; Oct. 1, 2006; Freescale Semiconductor, Inc.; IEEE Transactions on Electron Devices vol. 53 No. 10 pp. 26272633.

\* cited by examiner

*Primary Examiner* — Charles Garber
*Assistant Examiner* — Syed Gheyas (57) ABSTRACT

A method of processing a substrate is provided. The method includes forming a first oxide layer on the substrate and patterning the first oxide layer utilizing a lithography process, the patterning defining a plurality of active areas on the substrate. The method includes forming a second oxide layer in each active area and forming a plurality of metal electrodes over the second oxide layer through a shadow mask technique, wherein the shadow mask technique is performed without alignment to an active area.

17 Claims, 6 Drawing Sheets

METHOD FOR FORMING MOS CAPACITOR

BACKGROUND

Generally, metal-oxide-semiconductor (MOS) capacitor stacks are created on a semiconductor substrate through a number of processing steps. For example, a dielectric and electrode are formed on a substrate and subjected to a number of processes to alter functional characteristics of the devices and increase longevity. In order to increase capacitance while decreasing a size of the MOS capacitor stacks, new material discovery and testing is required.

When performing research, the alignment of the metal electrode with the active area that contains the dielectric is time consuming and extends the discovery process. In addition, the current shadow mask techniques leave the edges of the MOS capacitor stack exposed. The exposure of the edges can result in edge defects caused through oxidation.

It is within these contexts that the embodiments arise.

SUMMARY

In some embodiments, a method of processing a substrate is provided. The method includes forming a first oxide layer on the substrate and patterning the first oxide layer utilizing a lithography process. The patterning defining a plurality of active areas on the substrate. The method includes forming a second oxide layer in each active area and forming a plurality of metal electrodes over the second oxide layer through a shadow mask technique, wherein the shadow mask technique is performed without alignment to an active area.

These and further aspects are described more fully below.

DETAILED DESCRIPTION

Those skilled in the relevant art will recognize that many changes can be made to the embodiments described, while still obtaining the beneficial results. It will also be apparent that some of the desired benefits of the embodiments described can be obtained by selecting some of the features of the embodiments without utilizing other features. Accordingly, those skilled in the art will recognize that many modifications and adaptations to the embodiments described are possible and may even be desirable in certain circumstances. Thus, the following description is provided as illustrative of the principles of the embodiments of the invention and not in limitation thereof since the scope of the invention is defined by the claims. It will be obvious, however, to one skilled in the art, that the embodiments described may be practiced without some or all of these specific details. In other instances, well known process operations have not been described in detail in order not to unnecessarily obscure the present embodiments.

The embodiments describe methods and apparatuses for combinatorial optimization of parameters and materials for forming capacitor stacks. The capacitor stacks may include a substrate, an active area defined through a lithography process where a dielectric material is disposed in the active area, and a metal electrode defined through a shadow mask technique where the formation of the active area is decoupled from the formation of the metal electrode. The embodiments provide for the combination of the shadow mask technique for short cycle time with lithography defined active areas for improved device repeatability and reliability. In addition, the intentional pitch mismatch between the active and metal layers eliminates the need for alignment. The pitch mismatch causes the active and metal layers to overlap in some regions to form MOS device while in other regions the overlap may be partial or absent. The elimination of the alignment enables a much higher throughput to enhance the testing efficiency. Thus, a plurality of different parameters may be evaluated with a single substrate to ascertain associated properties of MOS capacitor stacks in an efficient manner. Accordingly, the embodiments described below may be integrated with combinatorial processing techniques described in more detail below.

Semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to (i) test different materials, (ii) test different processing conditions within each unit process module, (iii) test different sequencing and integration of processing modules within an integrated processing tool, (iv) test different sequencing of processing tools in executing different process sequence integration flows, and combinations thereof in the manufacture of devices such as integrated circuits. In particular, there is a need to be able to test (i) more than one material, (ii) more than one processing condition, (iii) more than one sequence of processing conditions, (iv) more than one process sequence integration flow, and combinations thereof, collectively known as "combinatorial process sequence integration," on a single monolithic substrate without the need for consuming the equivalent number of monolithic substrates per materials, processing conditions, sequences of processing conditions, sequences of processes, and combinations thereof. This can greatly improve both the speed and reduce the costs associated with the discovery, implementation, optimization, and qualification of materials, processes, and process integration sequences required for manufacturing.

High Productivity Combinatorial (HPC) processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

Systems and methods for HPC processing are described in U.S. Pat. No. 7,544,574, filed on Feb. 10, 2006; U.S. Pat. No. 7,824,935, filed on Jul. 2, 2008; U.S. Pat. No. 7,871,928, filed on May 4, 2009; U.S. Pat. No. 7,902,063, filed on Feb. 10, 2006; and U.S. Pat. No. 7,947,531, filed on Aug. 28, 2009 each of which is incorporated by reference herein. Systems and methods for HPC processing are further described in U.S. patent application Ser. No. 11/352,077, filed on Feb. 10, 2006; U.S. patent application Ser. No. 11/419,174, filed on May 18, 2006; U.S. patent application Ser. No. 11/674,132, filed on Feb. 12, 2007; and U.S. patent application Ser. No. 11/674,137, filed on Feb. 12, 2007. The aforementioned patent applications claim priority from provisional patent application 60/725,186 filed Oct. 11, 2005. Each of the aforementioned patent applications and the provisional patent application are incorporated by reference herein.

Figure 1:
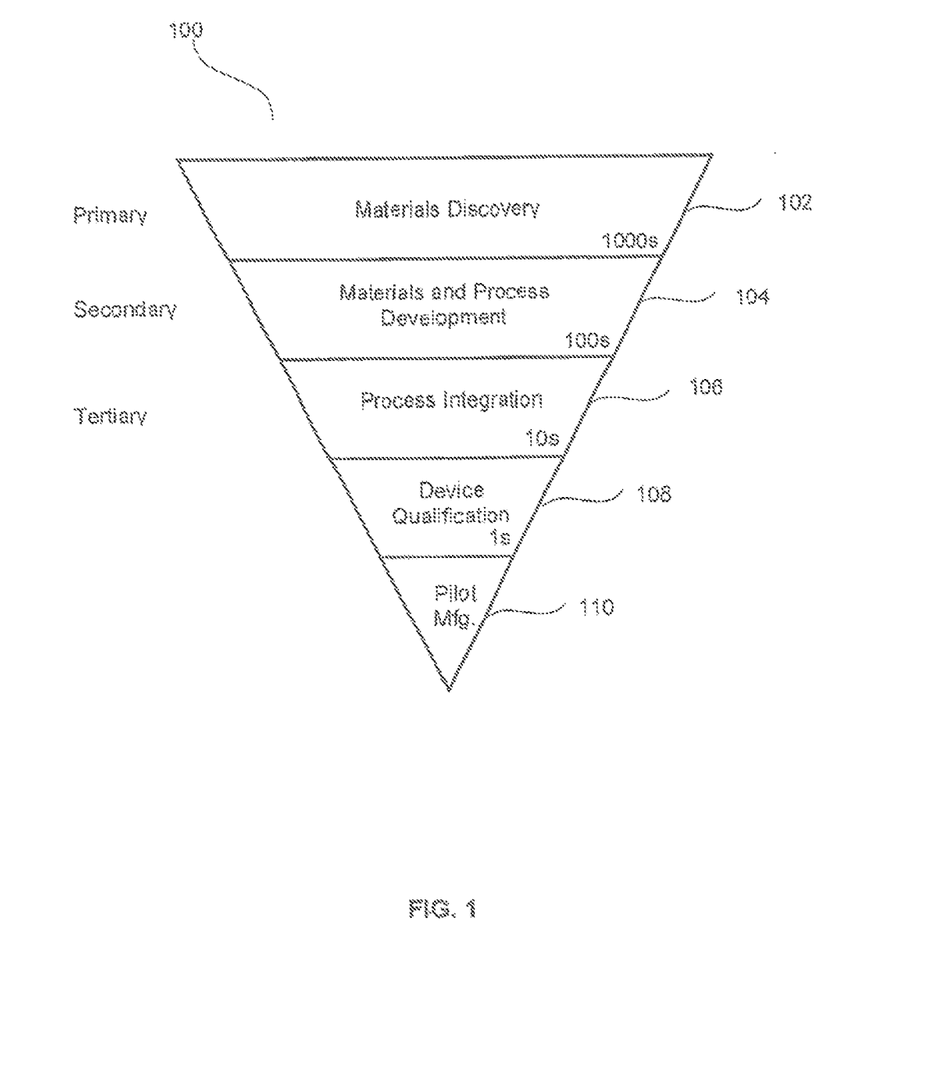
FIG. 1 illustrates a simplified schematic diagram providing an overview of the High-Productivity Combinatorial (HPC) screening process for use in evaluating materials, unit processes, and process sequences for the manufacturing of semiconductor devices in accordance with some embodiments.

FIG. 1 illustrates a schematic diagram 100 for implementing combinatorial processing and evaluation using primary, secondary, and tertiary screening. The schematic diagram 100 illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage 102. Materials discovery stage 102 is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage 104. Evaluation of the materials is performed using metrology tools such as electronic testers and imaging tools (e.g., microscopes).

The materials and process development stage 104 may evaluate hundreds of materials (i.e., a magnitude smaller than the primary stage) and may focus on the processes used to deposit or develop those materials. Promising materials and processes are again selected, and advanced to the tertiary screen or process integration stage 106 where tens of materials and/or processes and combinations are evaluated. The tertiary screen or process integration stage 106 may focus on integrating the selected processes and materials with other processes and materials.

The most promising materials and processes from the tertiary screen are advanced to device qualification 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 110.

The schematic diagram 100 is an example of various techniques that may be used to evaluate and select materials and processes for the development of new materials and processes. The descriptions of primary, secondary, etc. screening and the various stages 102-110 are arbitrary and the stages may overlap, occur out of sequence, be described and be performed in many other ways.

This application benefits from High Productivity Combinatorial (HPC) techniques described in U.S. patent application Ser. No. 11/674,137, filed on Feb. 12, 2007, which is hereby incorporated by reference in its entirety. Portions of the '137 application have been reproduced below to enhance the understanding of the embodiments disclosed herein. The embodiments disclosed enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as material characteristics of components utilized within the unit manufacturing operations. Rather than only considering a series of local optimums, i.e., where the best conditions and materials for each manufacturing unit operation is considered in isolation, the embodiments described below consider effects of interactions introduced due to the multitude of processing operations that are performed and the order in which such multitude of processing operations are performed when fabricating a device. A global optimum sequence order is therefore derived, and as part of this derivation, the unit processes, unit process parameters, and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform throughout each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameters (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
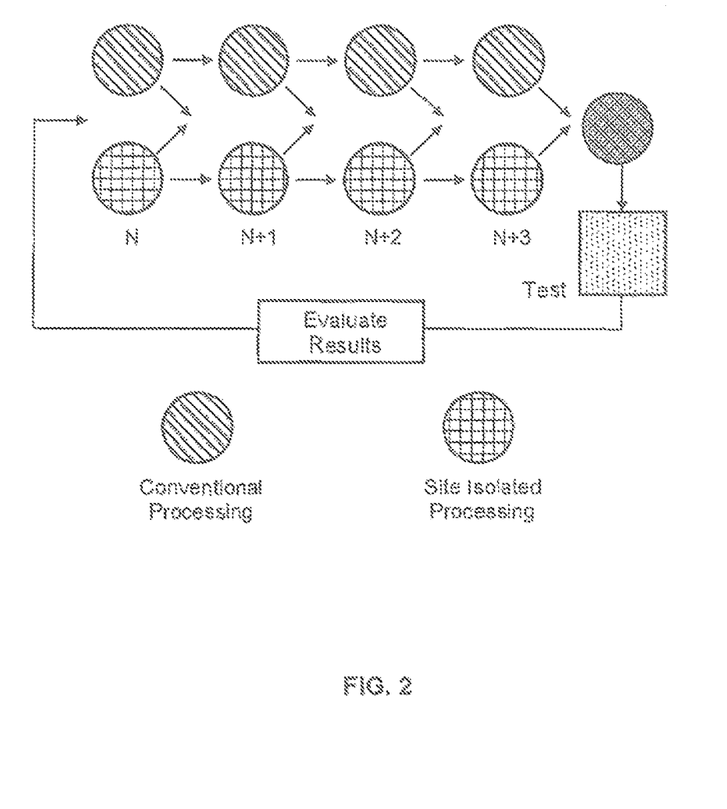
FIG. 2 illustrates a flowchart of a general methodology for combinatorial process sequence integration that includes site-isolated processing and/or conventional processing in accordance with some embodiments.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g., from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments described herein perform the processing locally in a conventional manner, i.e., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

As stated above, under combinatorial processing operations the processing conditions at different regions can be controlled independently. According to some embodiments of the present invention, individual apparatuses for controlled deposition onto different regions of a substrate for optimization of interlayer parameters are provided.

Figure 3:
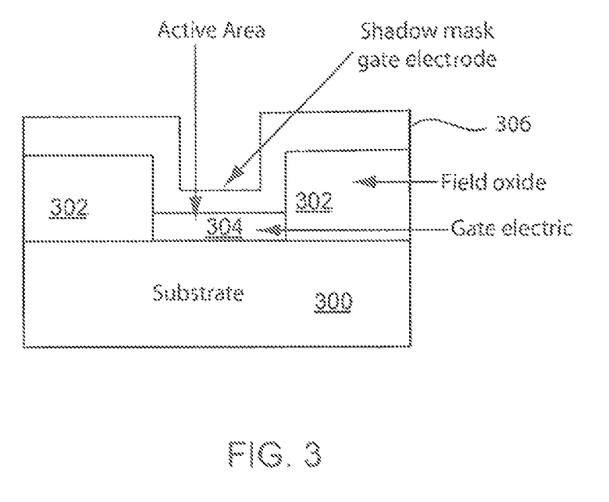
FIG. 3 is a simplified schematic diagram illustrating a cross sectional view of a MOS capacitor formed in accordance with some embodiments.

FIG. 3 is a simplified schematic diagram illustrating a cross sectional view of a MOS capacitor formed in accordance with some embodiments. Substrate 300 has field oxide layer 302 disposed there over. Field oxide layer 302 is patterned through a lithography process and a subsequent etch process in order to define active area 304 within the etched trench. Deposited within active area 304 is a dielectric material. The dielectric material within active area 304 may be grown or deposited through known deposition techniques in some embodiments. It should be appreciated that the trench in field oxide layer 302 defining active area 304 surrounds the peripheral edges of the dielectric material in order to prevent exposure to the ambient environment. In addition, the diameter of the dielectric in active area 304 is highly controlled and reproducible as the lithography and etch process defining the active area is an accurate and reproducible process. It should be appreciated that the control of the diameter reduces errors in the MOS capacitor testing due to differences in diameters among the different regions of the substrate where a plurality of active areas are defined for combinatorial processing. Gate electrode layer 306 is deposited over the active area and nearby field oxide surfaces. Gate electrode layer 306 is deposited through a shadow mask process, which has a relatively short cycle time as compared to a lithography process. Field oxide layer 302 is composed of silicon dioxide in some embodiments. It should be appreciated that any suitable dielectric material may be used for field oxide layer 302. The dielectric deposited within active area 304 may also be any suitable dielectric, such as a high K dielectric. Gate electrode layer 306 may be any suitable conductive metal. Examples of conductive metals for gate electrode layer 306 include tungsten, aluminum, tantalum nitride and titanium nitride. It should be appreciated that while a single device is illustrated in FIG. 3 this is not meant to be limiting as a plurality of devices may be defined across the surface of a substrate or coupon through the lithography and shadow mask techniques described herein.

Figure 4A:
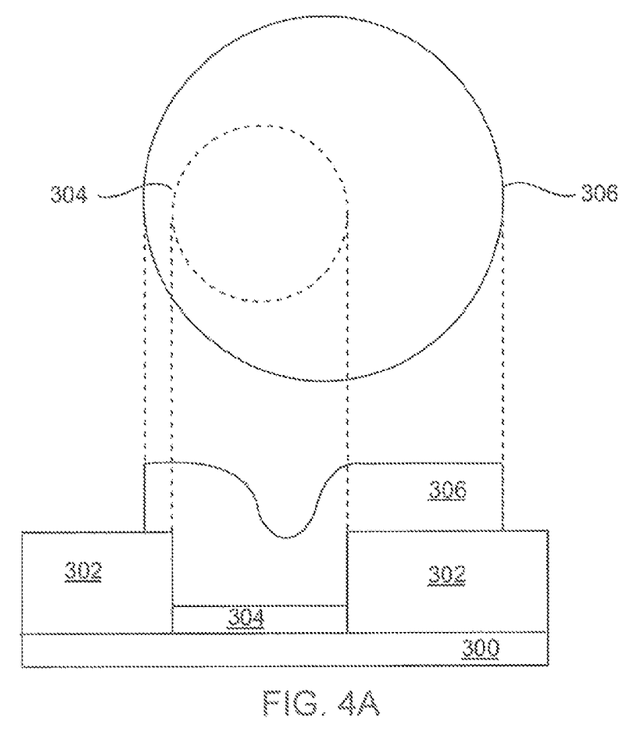
FIGS. 4A and 4B illustrate a combination of cross-sectional and top views of different regions of a substrate having an intentional pitch mismatch between the active areas defined on the substrate and the shadow mask metal electrode regions defined on the substrate in order to eliminate the need for alignment of the shadow mask utilized for forming the metal electrodes in accordance with some embodiments.
Figure 4B:
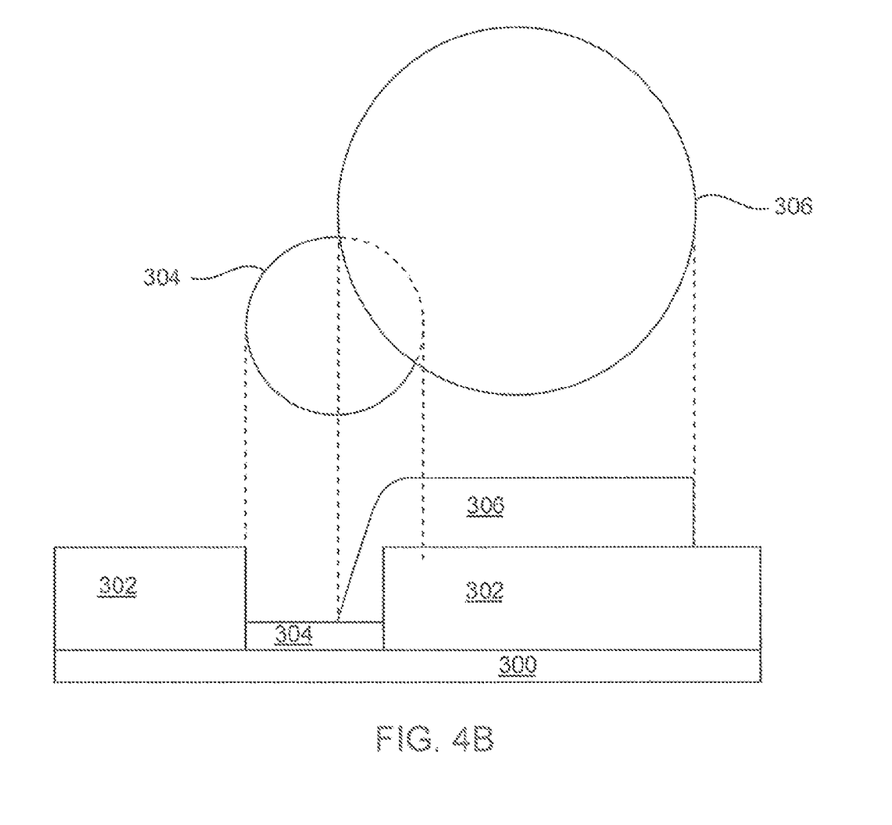
Figure 5:
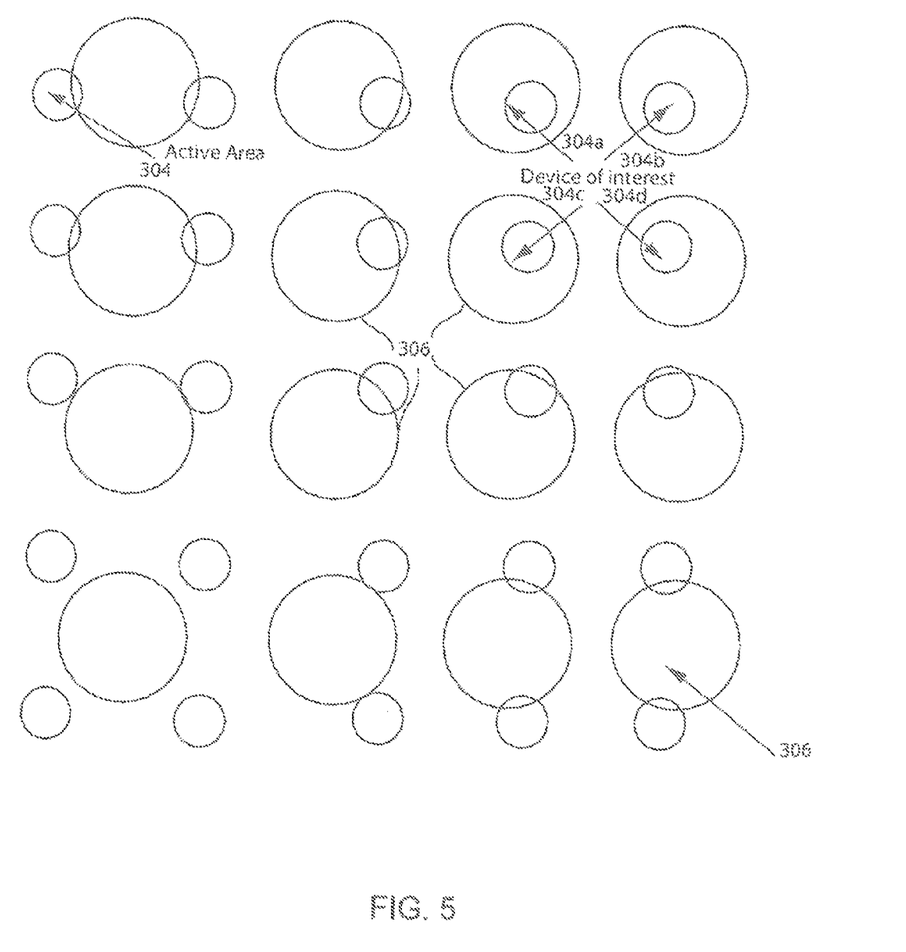
FIG. 5 is a simplified schematic diagram illustrating the pitch mismatch between active areas and shadow mask regions over a portion of the substrate in accordance with some embodiments.

FIGS. 4A and 4B illustrate views of different regions of a substrate having an intentional pitch mismatch between the active areas defined on the substrate and the shadow mask metal electrode regions defined on the substrate. It should be appreciated that the intentional pitch mismatch eliminates the need for alignment of the shadow mask metal electrodes to the active areas to reduce cycle time in accordance with some embodiments. In FIG. 4A, active region 304 is defined within a trench patterned through a lithography process. It should be appreciated that the lithography process enables defining a size of the active area that can be much smaller than the size defined through a conventional shadow mask. For example, in some embodiments the size of the active area defined through a lithography process can be 10μ or smaller, whereas the limit for a shadow mask process is typically 100μ. It should be further appreciated that the lithography process may be performed by known techniques where the surface of field oxide layer 302 is patterned with a resist and subsequently etched to define the pattern of active areas within field oxide layer 302. In the top portion of FIG. 4A, a top view of the cross sectional view of the MOS capacitor stack shadow mask region 306 disposed over an entirety of a surface of active region 304. FIG. 4B is a simplified schematic diagram illustrating the misalignment between shadow mask region 306 and active area. 304 in accordance with some embodiments. In FIG. 4B shadow mask region 306 is offset from an area defined over active area 304. That is, in the depiction of FIG. 4B shadow mask region 306 covers a portion of a surface of active region 304 and not an entirety of a surface of active region 304 as in FIG. 4A. It should be appreciated that with the intentional pitch mismatch between a plurality of active regions and a plurality of shadow mask regions as illustrated in FIG. 5, there may be some active areas and shadow mask regions that fully overlap, some that partially overlap, and some that do not overlap. However, the intentional pitch mismatch between the array of active areas and the shadow mask regions guarantee that at least some of the corresponding active areas and shadow mask regions fully overlap in order to perform desired testing.

FIG. 5 is a simplified schematic diagram illustrating the pitch mismatch between active areas and shadow mask regions over a portion of the substrate in accordance with some embodiments. Active areas 304 are disposed along a surface of a substrate according to a first pitch. Shadow mask regions 306 are disposed over the surface of the substrate according to a second pitch. As illustrated, a diameter of shadow mask regions 306 is greater than a diameter of active areas 304. Due to the difference in diameter and the pitch mismatch between the active areas 304 and the shadow mask regions 306 a portion of shadow mask regions 306 will be disposed completely over an entirety of a surface of active areas 304. In FIG. 5 active areas 304A-D have the corresponding shadow mask regions 306 disposed over an entirety of a surface of the active areas. Thus, the devices enabled through the complete overlap for active areas 304A-D can be tested and evaluated. As noted above, the field oxide protects the edges of the dielectric disposed in the active area from edge defects during as well as after fabrication. The active area is independent of the metal area in the embodiments described herein and the active area remains fixed across the wafer due to the use of the lithography process. No alignment is needed between the active area and shadow mask metal electrode due to the intentional pitch mismatch between these two layers of material. With combinations of pitch and device sizes, the dielectric in the active areas and the metal layers can be guaranteed to overlap at some locations which become the MOS devices of interest. Other locations with insufficient overlap or partial overlap can be ignored. In some embodiments, the wafers can be staged after the active area lithography process. A protective layer, such as a dry oxide, may be disposed over the surface of the substrate or wafer for staging. As the substrates are needed, the protective layer may be removed through an etch process and the dielectric can be grown or deposited and the gate electrode thereafter formed using the shadow mask technique.

Figure 6:
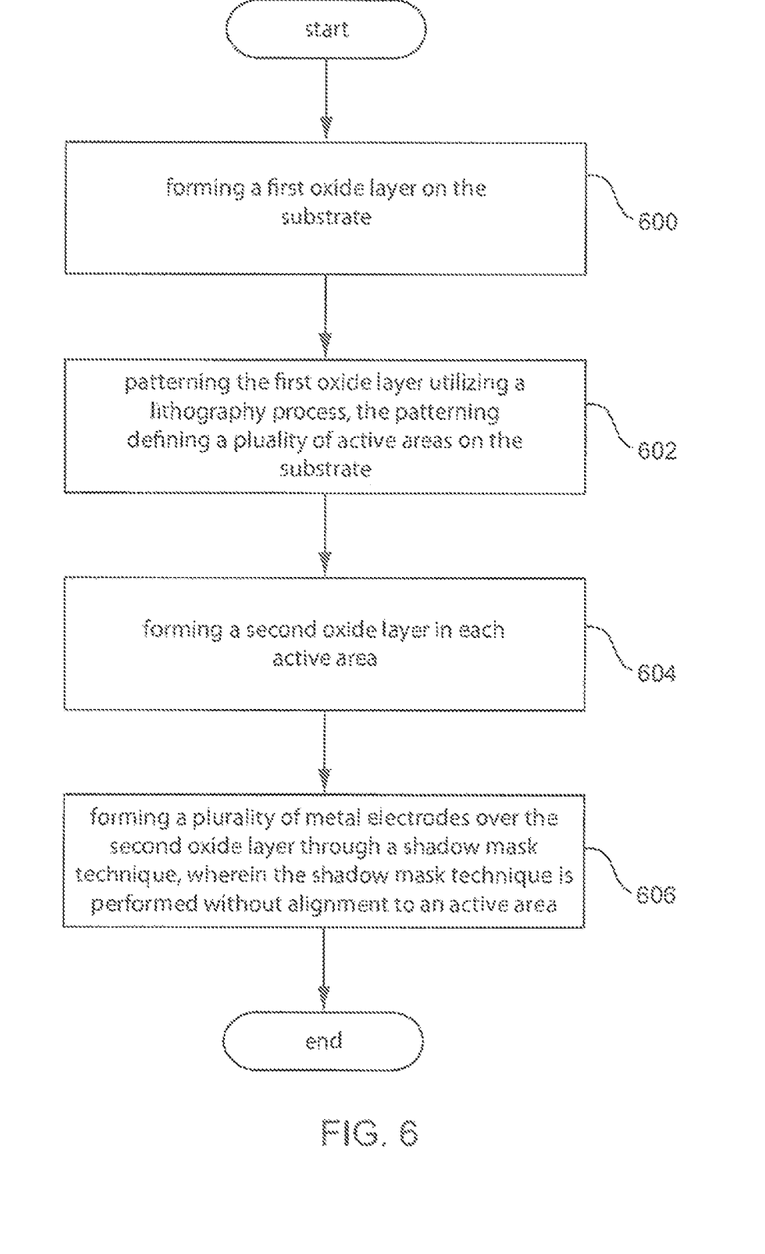
FIG. 6 is a flowchart diagram illustrating the method operations for combinatorially processing a substrate in accordance with some embodiments.

FIG. 6 is a flowchart diagram illustrating the method operations for combinatorially processing a substrate in accordance with some embodiments. The method initiates with operation 600 where a first oxide layer is formed over a surface of the substrate. The method then advances to operation 602 where the first oxide layer is patterned to define a plurality of active areas having a first pitch. The plurality of active areas may be defined through a lithography process where a dry or wet etch operation may be performed to pattern the active areas. The method then moves to operation 604 where a second oxide layer is deposited or grown in each of the plurality of active areas. It should be appreciated that the second oxide layer may be a high K dielectric in accordance with some embodiments. The method includes operation 606 where a plurality of metal electrodes are formed over the second oxide layer through a shadow mask operation, where the shadow mask comprises an array of apertures. It should be appreciated that the plurality of metal electrodes has a second pitch that is different than the first pitch. In some embodiments a diameter of each metal electrode of the plurality of metal electrodes is greater than a diameter of each area of the plurality of active areas. In some embodiments a radius of each aperture is greater than a radius of each active area on the substrate, and a pitch of the active areas is different than a pitch of the array of apertures. As a result of the spatial relationship and the difference between the first pitch and the second pitch, the need for alignment between the active area and the shadow mask is eliminated. In other words, there is no need for alignment between a pattern of the plurality of active areas and a pattern of the plurality of metal electrodes in the embodiments described herein. In some embodiments the value of the first pitch and the value of the second pitch are not whole number multiples of each other. That is, division of the value of the pitch of the plurality of metal electrodes by the value of the pitch of the active areas yields a non-whole number.

When compared to existing methods and apparatuses, the embodiments described can provide rapid combinatorial processing techniques which increase productivity in research and development of new materials, chemistries, and processing of semiconductor substrates and associated devices.

The corresponding structures, materials, acts, and equivalents of all means plus function elements in any claims below are intended to include any structure, material, or acts for performing the function in combination with other claim elements as specifically claimed.

Those skilled in the art will appreciate that many modifications to the exemplary embodiments are possible without departing from the spirit and scope of the present invention. In addition, it is possible to use some of the features of the present invention without the corresponding use of the other features. Accordingly, the foregoing description of the exemplary embodiments is provided for the purpose of illustrating the principles of the present invention, and not in limitation thereof, since the scope of the present invention is defined solely by the appended claims.

What is claimed:

1. A method of processing a substrate, comprising:
    forming a first oxide layer on the substrate;
    patterning the first oxide layer utilizing a lithography process, the patterning defining a plurality of active areas on the substrate;
    forming a second oxide layer in each active area; and
    forming a plurality of metal electrodes over the second oxide layer through a shadow mask technique, wherein the shadow mask comprises an array of apertures, wherein a radius of each aperture is greater than a radius of each active area on the substrate, and wherein a pitch of the active areas is different than a pitch of the array of apertures.

2. The method of claim 1, wherein the second oxide layer is formed in a combinatorial manner.

3. The method of claim 1, wherein after patterning the first oxide layer, the method comprises:
    staging the substrate for later use.

4. The method of claim 3, further comprising:
    depositing a protective oxide layer over a surface of the substrate prior to the staging.

5. The method of claim 4, comprising:
    removing the protective oxide layer prior to forming the second oxide layer.

6. The method of claim 1, wherein a shape of each active area of the plurality of active areas and a shape of each metal electrode of the plurality of metal electrodes is circular.

7. The method of claim 1, wherein a diameter of each active area is less than a diameter of each metal electrode.

8. The method of claim 2, wherein division of the pitch of the plurality of metal electrodes by the pitch of the active areas does not yield a whole number.

9. The method of claim 1, wherein peripheral edges of each active area are surrounded by the first oxide.

10. A method of processing a substrate, comprising:
    forming a first oxide layer on the substrate;
    patterning the first oxide layer utilizing a lithography process, the patterning defining a plurality of active areas on the substrate, the plurality of active areas having a first pitch;
    depositing a second oxide layer within each active area; and
    forming a plurality of metal electrodes over the second oxide layer through a shadow mask technique, the plurality of metal electrodes having a second pitch, wherein the second pitch is different than the first pitch, and wherein the plurality of metal electrodes are formed in a combinatorial manner.

11. The method of claim 10, wherein the shadow mask technique is performed without alignment between a pattern of the plurality of active areas and a pattern of the plurality of metal electrodes.

12. The method of claim 10, wherein a value of the second pitch is greater than a value of the first pitch.

13. The method of claim 10, wherein a diameter of each active area is less than a diameter of each metal electrode.

14. The method of claim 10, wherein the second oxide layer is deposited in a combinatorial manner.

15. The method of claim 14, wherein deposited in a combinatorial manner comprises, varying one of a material or a processing parameter for the depositing.

16. The method of claim 10, wherein the second oxide layer comprises a high k dielectric.

17. The method of claim 10, wherein the patterning comprises performing a wet etch operation.

* * * * *